US012033573B2

(12) United States Patent
Wang et al.

(10) Patent No.: US 12,033,573 B2
(45) Date of Patent: Jul. 9, 2024

(54) DISPLAY SUBSTRATE AND DISPLAY DEVICE

(71) Applicant: BOE Technology Group Co., Ltd., Beijing (CN)

(72) Inventors: Hongrun Wang, Beijing (CN); Pan Xu, Beijing (CN); Changfeng Li, Beijing (CN); Hui Zhang, Beijing (CN); Shunhang Zhang, Beijing (CN); Kai Hou, Beijing (CN); Liwei Liu, Beijing (CN); Yunsik Im, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 17/762,334

(22) PCT Filed: May 7, 2021

(86) PCT No.: PCT/CN2021/092096
§ 371 (c)(1),
(2) Date: Mar. 21, 2022

(87) PCT Pub. No.: WO2022/110650
PCT Pub. Date: Jun. 2, 2022

(65) Prior Publication Data
US 2024/0046859 A1    Feb. 8, 2024

(30) Foreign Application Priority Data
Nov. 24, 2020   (CN) .......................... 202011329916.3

(51) Int. Cl.
*G09G 3/3225*   (2016.01)
*H10K 59/131*   (2023.01)

(52) U.S. Cl.
CPC ......... *G09G 3/3225* (2013.01); *H10K 59/131* (2023.02); *G09G 2300/0426* (2013.01); *G09G 2310/0286* (2013.01)

(58) Field of Classification Search
CPC .. G11C 19/28; G09G 3/3233; G09G 2310/08; G09G 2310/0286;
(Continued)

(56) References Cited

U.S. PATENT DOCUMENTS

2007/0262929 A1* 11/2007 Kim .................... G09G 3/006
                                                        345/76
2008/0054798 A1*  3/2008 Jeong ................ G09G 3/3225
                                                        324/403
(Continued)

FOREIGN PATENT DOCUMENTS

CN   101752380 A   6/2010
CN   104064143 A   9/2014
(Continued)

OTHER PUBLICATIONS

CN 202011329916.3 first office action.
(Continued)

*Primary Examiner* — Shaheda A Abdin
(74) *Attorney, Agent, or Firm* — IPro, PLLC

(57) ABSTRACT

A display substrate and a display device are provided. Sub-pixels in a display substrate are divided into sub-pixel groups, wherein the sub-pixel groups include at least two sub-pixels, and at least two sub-pixels share the same pixel driving circuit; at least two light-emitting control sub-circuit in the pixel driving circuit correspond to at least two light-emitting element included in at least two sub-pixels, at least two light-emitting control sub-circuits correspond to at least two light-emitting control signal lines, and each light-emitting control sub-circuit is coupled to an output terminal (Continued)

of a compensation driving sub-circuit, a corresponding light-emitting element and a corresponding light-emitting control signal line; each light-emitting control sub-circuit is configured to control turning on or off a connection between the output terminal of the compensation driving sub-circuit and the corresponding light-emitting element under the control of the corresponding light-emitting control signal line.

20 Claims, 11 Drawing Sheets

(58) Field of Classification Search
CPC ..... G09G 2300/0819; G09G 2300/043; G09G 2300/0426; G09G 2300/0842; G09G 3/3266
See application file for complete search history.

(56) References Cited

U.S. PATENT DOCUMENTS

| | | | |
|---|---|---|---|
| 2015/0145850 A1* | 5/2015 | Rohatgi | G09G 3/006 345/212 |
| 2015/0364087 A1 | 12/2015 | Gu | |
| 2016/0012779 A1 | 1/2016 | Gu et al. | |
| 2017/0110055 A1 | 4/2017 | Li et al. | |
| 2017/0249900 A1 | 8/2017 | Xiang et al. | |
| 2018/0011355 A1 | 1/2018 | Miyake et al. | |
| 2018/0261159 A1* | 9/2018 | Chaji | G09G 3/3266 |
| 2019/0207036 A1 | 7/2019 | Tian et al. | |
| 2019/0325823 A1 | 10/2019 | Yang et al. | |
| 2019/0340979 A1 | 11/2019 | Yang et al. | |
| 2020/0012369 A1 | 1/2020 | Guo et al. | |
| 2020/0273411 A1* | 8/2020 | Gao | G09G 3/3291 |
| 2021/0118366 A1 | 4/2021 | Xuan et al. | |
| 2021/0134220 A1 | 5/2021 | Pappas et al. | |
| 2021/0183313 A1 | 6/2021 | Dong et al. | |
| 2021/0217352 A1 | 7/2021 | Xuan et al. | |
| 2021/0375203 A1 | 12/2021 | Chen et al. | |
| 2021/0390904 A1 | 12/2021 | Xuan et al. | |
| 2022/0335889 A1* | 10/2022 | Zheng | G11C 19/28 |

FOREIGN PATENT DOCUMENTS

| | | | | |
|---|---|---|---|---|
| CN | 104751804 A | 7/2015 | | |
| CN | 106297672 A | 1/2017 | | |
| CN | 106531085 A | 3/2017 | | |
| CN | 106782301 A | 5/2017 | | |
| CN | 107065361 A | 8/2017 | | |
| CN | 107170408 A | 9/2017 | | |
| CN | 108182921 A | 6/2018 | | |
| CN | 108399895 A | 8/2018 | | |
| CN | 108877664 A | 11/2018 | | |
| CN | 109003573 A | 12/2018 | | |
| CN | 109003574 A | 12/2018 | | |
| CN | 109416900 A | 3/2019 | | |
| CN | 110226195 A | 9/2019 | | |
| CN | 110226195 A | * 9/2019 | | G09G 3/32 |
| CN | 110289296 A | 9/2019 | | |
| CN | 110391267 A | 10/2019 | | |
| CN | 110568683 A | 12/2019 | | |
| CN | 110706653 A | 1/2020 | | |
| CN | 110992880 A | 4/2020 | | |
| CN | 210607260 U | 5/2020 | | |
| CN | 111261113 A | 6/2020 | | |
| CN | 111430434 A | 7/2020 | | |
| CN | 111463255 A | 7/2020 | | |
| CN | 111477669 A | 7/2020 | | |
| CN | 210984240 U | 7/2020 | | |
| CN | 111584599 A | 8/2020 | | |
| CN | 112435629 A | 3/2021 | | |
| CN | 112436042 A | 3/2021 | | |
| WO | WO-2019062579 A1 | * 4/2019 | | G09G 3/3233 |

OTHER PUBLICATIONS

CN 202011329916.3 second office action.
PCT/CN2021/092096 international search report and written opinion.

* cited by examiner

DISPLAY SUBSTRATE AND DISPLAY DEVICE

CROSS REFERENCE TO RELATED APPLICATIONS

This application is the U.S. national phase of PCT Application No. PCT/CN2021/092096 filed on May 7, 2021, which claims priority to Chinese Patent Application No. 202011329916.3, filed in China on Nov. 24, 2020, the disclosure of which is incorporated by reference in its entirety.

TECHNICAL FIELD

The present disclosure relates to the technical field of displaying, and in particular, to a display substrate and a display device.

BACKGROUND

Organic Light-Emitting Diode (OLED) display devices are widely used in various fields due to advantages of high brightness, low power consumption, fast response, high definition, good flexibility, and high luminous efficiency. The OLED display device includes a plurality of sub-pixels, each sub-pixel includes a pixel driving circuit and a light-emitting element, the pixel driving circuit is configured to drive a light-emitting element to emit light. Since all the pixel driving circuit in the OLED display device are disposed in an array at a substrate, the number of pixel driving circuit that can be arranged within a certain region is limited subject to factors such as line width, line spacing and via hole size, thus resulting in a difficulty in realizing an OLED display device with a high resolution.

SUMMARY

The present disclosure is to provide a display substrate and a display device.

To achieve this, the present disclosure provides technical solution as follows.

In a first aspect of the present disclosure, a display substrate is provided, including a substrate and a plurality of sub-pixels provided on the substrate, each sub-pixel including a light-emitting element;

where the plurality of sub-pixels is divided into a plurality of sub-pixel groups, the plurality of sub-pixel groups each comprises at least two sub-pixels, the at least two sub-pixels share the same pixel driving circuit, and the pixel driving circuit comprises:

at least two light-emitting control signal lines, at least part of each of the at least two light-emitting control signal lines extending in a first direction, and the at least two light-emitting control signal lines being arranged in a second direction, the second direction intersecting with the first direction;

a compensation driving sub-circuit, an output terminal of the compensation driving sub-circuit being configured to output a driving signal;

at least two light-emitting control sub-circuits, wherein the at least two light-emitting control sub-circuits correspond to at least two light-emitting elements comprised in the at least two sub-pixels, the at least two light-emitting control sub-circuits correspond to the at least two light-emitting control signal lines, and each of the at least two light-emitting control sub-circuits is coupled to the output terminal of the compensation driving sub-circuit, a corresponding light-emitting element and a corresponding light-emitting control signal line; each of the at least two light-emitting control sub-circuits is configured to control a connection between the output terminal of the compensation driving sub-circuit and the corresponding light-emitting element to be connected or disconnected under the control of the corresponding light-emitting control signal line.

Optionally, the pixel driving circuit further includes:

a reference signal line, at least part of the reference signal line extending in the first direction;

a first reset signal line, at least part of the first reset signal line extending in the first direction;

a gate line, at least part of the gate line extending in the first direction;

a power source line, at least part of the power source line extending in a second direction; and, a data line, at least part of the data line extending in the second direction;

wherein the compensation driving sub-circuit comprises:

a driving sub-circuit, a first terminal of the driving sub-circuit is coupled to the power source line, and a second terminal of the driving sub-circuit is the output terminal of the compensation driving sub-circuit;

a storage sub-circuit, a first terminal of the storage sub-circuit is coupled to a control terminal of the driving sub-circuit, and a second terminal of the storage sub-circuit is coupled to the second terminal of the driving sub-circuit;

a first reset sub-circuit, coupled to the first reset signal line, the reference signal line and the control terminal of the driving sub-circuit; and a data writing sub-circuit, coupled to the gate line, the data line and the control terminal of the driving sub-circuit.

Optionally, the at least two light-emitting control signal lines comprise a first light-emitting control signal line and a second light-emitting control signal line; the at least two light-emitting control sub-circuits comprise a first light-emitting control sub-circuit and a second light-emitting control sub-circuit; the at least two light-emitting elements comprise a first light-emitting element and a second light-emitting element;

the first light-emitting control sub-circuit is coupled to the second terminal of the driving sub-circuit, the first light-emitting control signal line and the first light-emitting element; the second light-emitting control sub-circuit is coupled to the second terminal of the driving sub-circuit, the second light-emitting control signal line, and the second light-emitting element.

Optionally, the first light-emitting control sub-circuit comprises a first transistor, the second light-emitting control sub-circuit comprises a second transistor, and the driving sub-circuit comprises a drive transistor; the storage sub-circuit comprises a storage capacitor;

a gate electrode of the drive transistor is reused as a first electrode plate of the storage capacitor;

a second electrode plate of the storage capacitor is located at a side of the first electrode plate facing away from the substrate, and the second electrode plate is coupled to a second electrode of the drive transistor;

a first electrode of the first transistor is coupled to the second electrode of the drive transistor, and a second electrode of the first transistor is coupled to the first light-emitting element;

a first electrode of the second transistor is coupled to the second electrode plate, and a second electrode of the second transistor is coupled to the second light-emitting element.

Optionally, the first transistor comprises a first active pattern, the first active pattern extends in the second direction; a first terminal of the first active pattern is coupled to the second electrode of the drive transistor; a second terminal of the first active pattern is coupled to the first light-emitting element;

an orthographic projection of the second terminal of the first active pattern onto the substrate is located between an orthographic projection of the first light-emitting control signal line onto the substrate and an orthographic projection of the second light-emitting control signal line onto the substrate.

Optionally, the second electrode plate comprises a body portion and an extension portion;

an orthographic projection of the body portion onto the substrate at least partially overlaps with an orthographic projection of the gate electrode of the drive transistor onto the substrate;

the extension portion extends in the second direction, and an orthographic projection of the extension portion onto the substrate overlaps with an orthographic projection of the first light-emitting control signal line onto the substrate and an orthographic projection of the second light-emitting control signal line onto the substrate.

Optionally, the second transistor comprises a second active pattern, at least part of the second active pattern extends in the second direction, a first terminal of the second active pattern is coupled to the extension portion, a second terminal of the second active pattern is coupled to the second light-emitting element;

an orthographic projection of the first terminal of the second active pattern onto the substrate is located between the orthographic projection of the first light-emitting control signal line onto the substrate and the orthographic projection of the second light-emitting control signal line onto the substrate.

Optionally, the pixel driving circuit further includes:

an initialization signal line, at least part of the initialization signal line extending in the first direction;

a second reset signal line, at least part of the second reset signal line extending in the first direction; the first reset signal line, the gate line, the first light-emitting control signal line, the second light-emitting control signal line and the second reset signal line are arranged successively in the second direction;

a second reset sub-circuit, coupled to the second reset signal line, the initialization signal line and the extension portion.

Optionally, the second reset sub-circuit includes a fifth transistor, the fifth transistor including a fifth active pattern, the fifth active pattern extending in the second direction;

a first terminal of the fifth active pattern is coupled to the extension portion, and an orthographic projection of the first terminal of the fifth active pattern onto the substrate is located between the orthographic projection of the second light-emitting control signal line onto the substrate and an orthographic projection of the second reset signal line onto the substrate.

Optionally, the fifth active pattern and the initialization signal line are formed as an integral structure.

Optionally, an orthographic projection of the first reset signal line onto the substrate is located between an orthographic projection of the reference signal line onto the substrate and an orthographic projection of the gate line onto the substrate;

the first reset sub-circuit comprises a third transistor, the third transistor comprises a third active pattern, the third active pattern extends in the second direction, a first terminal of the third active pattern is coupled to the reference signal line, an orthographic projection of a second terminal of the third active pattern onto the substrate is located between the orthographic projection of the first reset signal line onto the substrate and the orthographic projection of the gate line onto the substrate.

Optionally, the gate line comprises a gate body portion and two gate protruding portions, the gate body portion extends in the first direction, the two gate protruding portions are provided at an interval in the first direction, the two gate protruding portions are located between the gate body portion and the first reset signal line;

the data writing sub-circuit comprises a fourth transistor, the fourth transistor comprises a fourth active pattern, the fourth active pattern extends in the first direction, and an orthographic projection of the fourth active pattern onto the substrate overlaps with orthographic projections of the two gate protruding portions onto the substrate, respectively;

a first terminal of the fourth active pattern is coupled to the data line, and a second terminal of the fourth active pattern is coupled to the second terminal of the third active pattern.

Optionally, t the pixel driving circuit comprises a conductive connection portion, at least part of the conductive connection portion extends in the second direction, an orthographic projection of the conductive connection portion onto the substrate overlaps with the orthographic projection of the gate line onto the substrate;

a first terminal of the conductive connection portion is coupled to the second terminal of the third active pattern and a second terminal of the conductive connection portion is coupled to the control terminal of the driving sub-circuit.

Based on the technical solution of the above-mentioned display substrate, in a second aspect of the present disclosure, a display device including the above-mentioned display substrate is provided.

Optionally, at least two light-emitting control signal lines in the display substrate comprise a first light-emitting control signal line and a second light-emitting control signal line; at least two light-emitting control sub-circuits comprise a first light-emitting control sub-circuit and a second light-emitting control sub-circuit; at least two light-emitting elements comprise a first light-emitting element and a second light-emitting element;

a plurality of pixel driving circuits comprised in a plurality of sub-pixel groups in the display substrate are arranged in an array, the plurality of pixel driving circuits are divided into a plurality of rows of pixel driving circuits arranged in the second direction, first light-emitting control signal lines in the plurality of rows of pixel driving circuits are coupled, and second light-emitting control signal lines in the plurality of rows of pixel driving circuits are coupled;

the display device further comprises: a gate driving circuit located in a peripheral region of the display substrate, wherein the gate driving circuit comprises a plurality of first shift register units and a plurality of second shift register units; the plurality of first shift register units is in one-to-one correspondence with the plurality of rows of pixel driving circuits, and the plurality of second shift register units is in one-to-one correspondence with the plurality of rows of pixel driving circuits;

an output terminal of the first shift register unit is coupled to a first light-emitting control signal line in a corresponding row of pixel driving circuit, and an output terminal of the second shift register unit is coupled to a second light-emitting control signal line in a corresponding row of pixel driving circuit.

BRIEF DESCRIPTION OF THE DRAWINGS

The accompanying drawings illustrated herein are to provide a further understanding of the present disclosure and are incorporated in and constitute a part of the present disclosure, illustrate embodiments of the present disclosure and the description thereof are to explain the present disclosure and do not constitute an undue limitation of the present disclosure. In the drawings.

DETAILED DESCRIPTION

Figure 1:
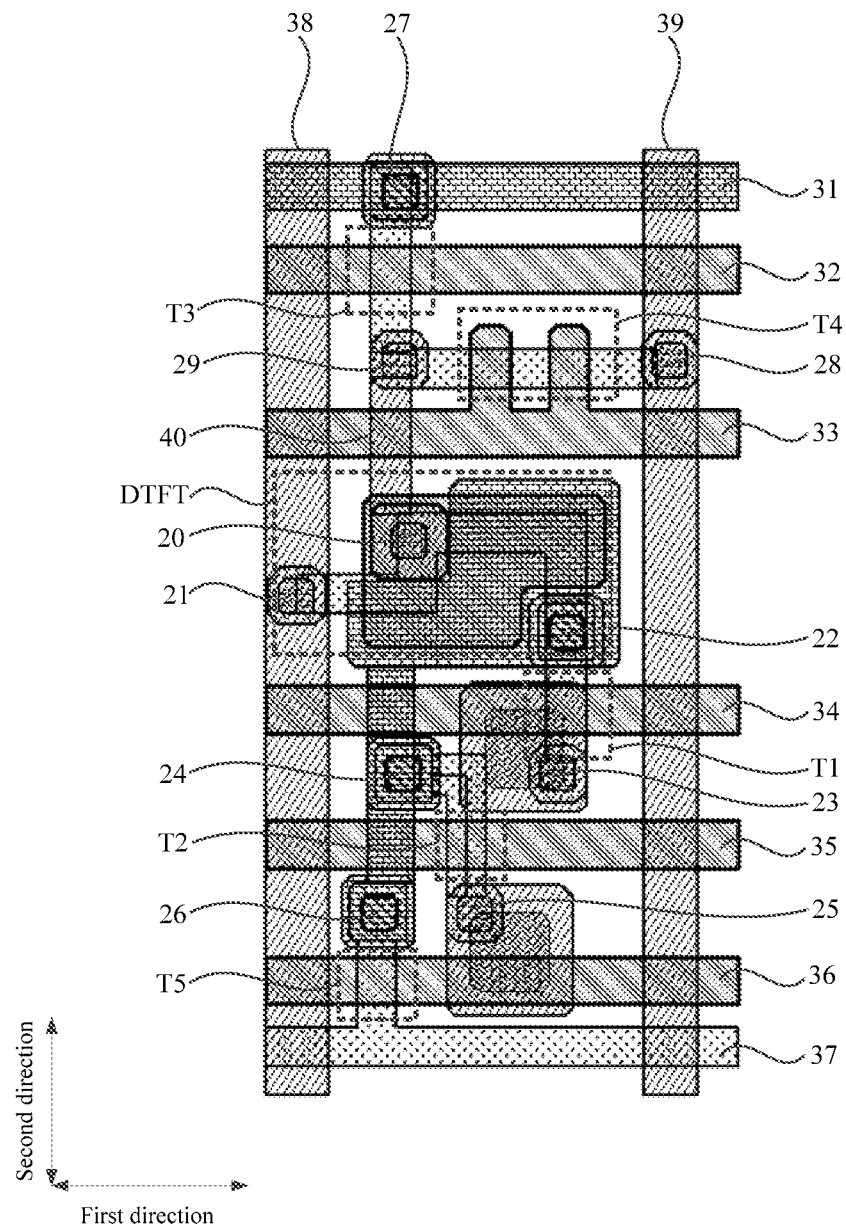
FIG. 1 is a schematic diagram of a layout of a pixel driving circuit provided by embodiments of the present disclosure.

To further illustrate the display substrate and display device provided by embodiments of the present disclosure, the following detailed description is made with reference to the accompanying drawings.

The present disclosure embodiment provides a display substrate, including a substrate and a plurality of sub-pixels provided on the substrate, each sub-pixel including a light-emitting element;

the plurality of sub-pixels are divided into a plurality of sub-pixel groups; the sub-pixel groups each include at least two sub-pixels; the at least two sub-pixels share the same pixel driving circuit; and the pixel driving circuit includes:

at least two light-emitting control signal lines, at least part of each of the light-emitting control signal lines extending in a first direction, at least two light-emitting control signal lines being arranged in a second direction, the second direction intersecting with the first direction;

a compensation driving sub-circuit, an output terminal of the compensation driving sub-circuit being configured to outputting a driving signal;

at least two light-emitting control sub-circuits, where the at least two light-emitting control sub-circuits correspond to at least two light-emitting elements included in the at least two sub-pixels, the at least two light-emitting control sub-circuits correspond to the at least two light-emitting control signal lines, and each of the light-emitting control sub-circuits is coupled to an output terminal of the compensation driving sub-circuit, a corresponding light-emitting element and a corresponding light-emitting control signal line, respectively; each of the light-emitting control sub-circuit is configured to control to turn on or turn off a connection between the output terminal of the compensation driving sub-circuit and the corresponding light-emitting element under the control of the corresponding light-emitting control signal line.

Illustratively, the at least two light-emitting control sub-circuits are in one-to-one correspondence with at least two light-emitting elements included in the at least two sub-pixels, and the at least two light-emitting control sub-circuits are in one-to-one correspondence with the at least two light-emitting control signal lines.

Illustratively, the light-emitting element includes an anode and a cathode oppositely provided, and an organic light-emitting material layer located between the anode and the cathode.

Illustratively, each sub-pixel group includes at least two sub-pixels adjacent to one another in the first direction.

Illustratively, each sub-pixel group includes at least two sub-pixels adjacent to one another in the second direction.

Illustratively, each sub-pixel group includes a plurality of sub-pixels, the plurality of sub-pixels includes sub-pixels adjacent to one another in the first direction and sub-pixels adjacent to one another in the second direction.

Illustratively, sub-pixels included in the sub-pixel group shares a common pixel driving circuit.

Illustratively, the first direction includes a horizontal direction and the second direction includes a vertical direction.

Illustratively, the compensation driving sub-circuit is configured to generate a current signal for driving the light-emitting element to emit light.

Illustratively, under the control of the at least two light-emitting control signal lines during the same time period, only one light-emitting control sub-circuit in the at least two light-emitting control sub-circuits can control to connect the connection between the output terminal of the compensation driving sub-circuit and the corresponding light-emitting element, and the other light-emitting control sub-circuits control to disconnect the connection between the output terminal of the complementary driving sub-circuit and the corresponding light-emitting element.

Illustratively, under the control of the at least two light-emitting control signal lines during the same time period, a plurality of light-emitting control sub-circuits in the at least two light-emitting control sub-circuits can control to connect the connection between the output terminal of the compensation driving sub-circuit and the corresponding light-emitting element.

According to the specific structure of the above-mentioned display substrate, it can be seen that in the display substrate provided by embodiments of the present disclosure, at least two sub-pixels can share one common pixel driving circuit, and the pixel driving circuit can independently control the light-emitting elements included in various pixels of the at least two sub-pixels to emit light independently or emit light simultaneously. Therefore, the display substrate provided by the embodiments of the present disclosure can realize a high-resolution display in case of arranging the limited number of pixel driving circuits.

As shown in FIGS. 1 to 6 and FIG. 8, in some embodiments, the pixel driving circuit further includes:

a reference signal line 31, at least part of the reference signal line 31 extending in a first direction;

a first reset signal line 32, at least part of the first reset signal line 32 extending in a first direction;

a gate line 33, at least part of the gate line 33 extending in the first direction;

a power source line 38, at least part of the power source line 38 extending in a second direction; and, a data line 39, at least part of the data line 39 extending in the second direction;

the compensation driving sub-circuit includes:

a driving sub-circuit 10, where a first terminal of the driving sub-circuit 10 is coupled to the power source line 38, and a second terminal of the driving sub-circuit 10 is an output terminal of the compensation driving sub-circuit;

a storage sub-circuit 11, a first terminal of the storage sub-circuit 11 is coupled to a control terminal of the driving sub-circuit 10, and a second terminal of the storage sub-circuit 11 is coupled to the second terminal of the driving sub-circuit 10;

a first reset sub-circuit 12 coupled to the first reset signal line 32, the reference signal line 31 and the control terminal of the driving sub-circuit 10;

a data writing sub-circuit 13 is coupled to the gate line 33, the data line 39 and the control terminal of the driving sub-circuit 10.

Illustratively, the reference signal line 31 is for providing a reference signal Vref, the reference signal Vref is a direct current signal.

Illustratively, an orthographic projection of the reference signal line 31 onto the substrate, an orthographic projection of the first reset signal line 32 onto the substrate, and an orthographic projection of the gate line 33 onto the substrate are sequentially arranged in the second direction.

Illustratively, the power source line 38 and the data line 39 are arranged in the first direction.

Illustratively, the power source line 38 and the data line 39 are provided in the same layer and by the material.

Illustratively, the illustrated power source line 38 provides a positive power source signal ELVDD, a cathode of the light-emitting element receives a negative power source signal ELVSS.

Illustratively, the first reset sub-circuit 12 and the driving sub-circuit 10 are arranged in the second direction.

Illustratively, an orthographic projection of the driving sub-circuit 10 onto the substrate, an orthographic projection of the storage sub-circuit 11 onto the substrate, and an orthographic projection of the first reset sub-circuit 12 onto the substrate are all located between an orthographic projection of the power source line 38 onto the substrate and an orthographic projection of the data line 39 onto the substrate.

As shown in FIGS. 1-6 and FIG. 8, in some embodiments, the at least two light-emitting control signal lines include a first light-emitting control signal line 34 and a second light-emitting control signal line 35; the at least two light-emitting control sub-circuits include a first light-emitting control sub-circuit 15 and a second light-emitting control sub-circuit 16; the at least two light-emitting elements include a first light-emitting element EL1 and a second light-emitting element EL2;

The first light-emitting control sub-circuit 15 is coupled to a second terminal of the driving sub-circuit 10, the first light-emitting control signal line 34 is coupled to the first light-emitting element EL1; the second light-emitting control sub-circuit 16 is coupled to the second terminal of the driving sub-circuit 10, the second light-emitting control signal line 35 and the second light-emitting element EL2.

Illustratively, the first light-emitting control signal line 34 and the second light-emitting control signal line 35 both extend in the first direction, and the first light-emitting control signal line 34 and the second light-emitting control signal line 35 are arranged in the second direction.

Illustratively, an organic light-emitting material layer of the first light-emitting element EL1 and an organic light-emitting material layer of the second light-emitting element EL2 are arranged in the first direction; or the organic light-emitting material layer of the first light-emitting element EL1 and the organic light-emitting material layer of the second light-emitting element EL2 are arranged in the second direction.

The first light-emitting control sub-circuit 15 is capable of controlling the connection between the second terminal of the driving sub-circuit 10 and the first light-emitting element EL1 to be connected or disconnected under the control of the first light-emitting control signal line 34. The second light-emitting control sub-circuit 16 is capable of controlling the connection between the second terminal of the driving sub-circuit 10 and the second light-emitting element EL2 to be connected or disconnected under the control of the second light-emitting control signal line 35.

Illustratively, in the same display period, the first light-emitting control sub-circuit 15 controls to connect the connection between the second terminal of the driving sub-circuit 10 and the corresponding first light-emitting element EL1, and the second light-emitting control sub-circuit 16 controls to connect the connection between the second terminal of the driving sub-circuit 10 and the corresponding first light-emitting element EL1.

Figure 10:
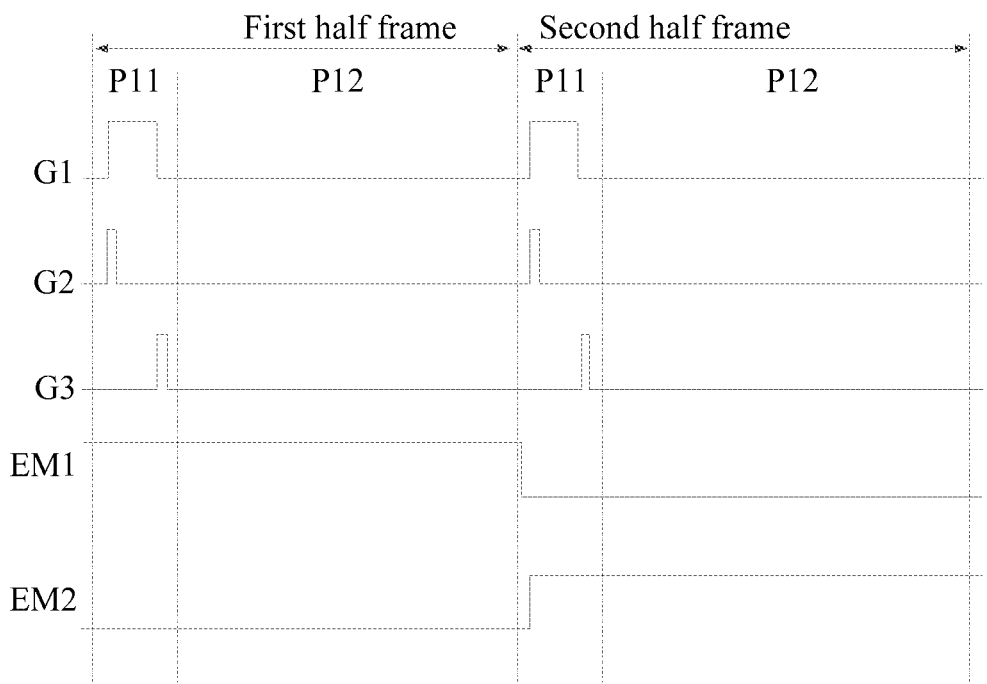
FIG. 10 is an operating timing diagram for the pixel driving circuit over a frame of display time provided by embodiments of the present disclosure.

Illustratively, as shown in FIG. 10, a frame of display time is divided into a first half frame and a second half frame, and the first half frame and the second half frame both include a signal writing period P11 and a light-emitting period P12. During the signal writing period in the first half frame, the compensation driving sub-circuit completes the process of grayscale writing and compensation for a corresponding first light-emitting element EL1. During the light-emitting period in the first half frame, under the control of the first light-emitting control signal line 34, the first light-emitting control sub-circuit 15 controls to connect the connection between the output terminal of the compensation driving sub-circuit and the corresponding first light-emitting element EL1, to cause the first light-emitting element EL1 to emit light; under the control of the second light-emitting control signal line 35, the second light-emitting control sub-circuit 16 controls to disconnect the connection between the output terminal of the compensation driving sub-circuit and the corresponding second light-emitting element EL2, to cause the second light-emitting element EL2 not to emit light.

During the signal writing period in the second half frame, the compensation driving sub-circuit completes the process of grayscale writing and compensation for a corresponding second light-emitting element EL2. During the light-emitting period in the second half frame, under the control of the first light-emitting control signal line 34, the first light-emitting control sub-circuit 15 controls to disconnect the connection between the output terminal of the compensation driving sub-circuit and the corresponding first light-emitting element EL1, to cause the first light-emitting element EL1 not to emit light; under the control of a second light-emitting control signal line 35, the second light-emitting control sub-circuit 16 controls to connect the connection between the output terminal of the compensation driving sub-circuit and the corresponding second light-emitting element EL2, to cause the second light-emitting element EL2 to emit light.

It is be noted that in a case where each sub-pixel group includes N sub-pixels, N is an integer greater than or equal to 2, each frame of display time can be divided into N sub-frames, and the processes of grayscale writing, compensation and display are implemented for a corresponding light-emitting element at each sub-frame. In a case that each frame of display time is divided into N sub-frames, there can be no interference between the processes of grayscale writing and signal compensation corresponding to each of the sub-frames, and thus an independent control of N light-emitting elements can be realized.

In the display substrate provided by the above-mentioned embodiments, N sub-pixels can share one pixel driving circuit, and a time-sharing display or simultaneous display of each sub-pixel can be realized, avoiding providing an independent pixel driving circuit for each pixel, so that the space utilization rate for the layout of the pixel driving circuit in the display substrate can be improved.

As shown in FIGS. 1 to 5, 7 and 9, in some embodiments, the first light-emitting control sub-circuit 15 includes a first transistor T1, the second light-emitting control sub-circuit 16 includes a second transistor T2, and the driving sub-circuit 10 includes a drive transistor DTFT; the storage sub-circuit 11 includes a storage capacitor Cst;

a gate electrode g of the drive transistor DTFT is reused as a first electrode plate Cst1 of the storage capacitor Cst;

a second electrode plate Cst2 of the storage capacitor Cst is located on a side of the first electrode plate Cst1 facing away from the substrate, and the second electrode plate Cst2 is coupled to a second electrode of the drive transistor DTFT;

a first electrode of the first transistor T1 is coupled to the second electrode of the drive transistor DTFT, and a second electrode of the first transistor T1 is coupled to a first light-emitting element EL1;

a first electrode of the second transistor T2 is coupled to the second electrode plate Cst2, and a second electrode of the second transistor T2 is coupled to the second light-emitting element EL2.

Figure 2:
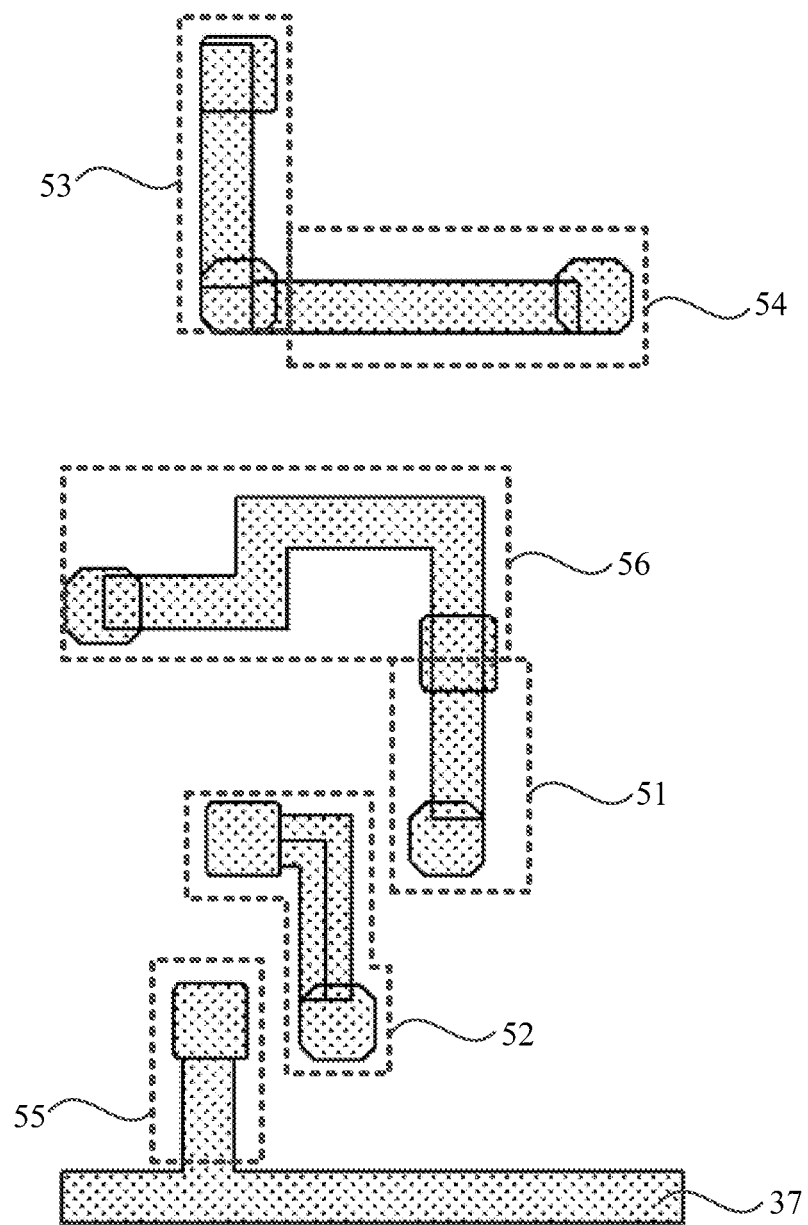
FIG. 2 is a schematic diagram of an active layer in FIG. 1.

Illustratively, as shown in FIG. 2, the drive transistor DTFT includes a driving active pattern 56, the driving active pattern 56 includes a portion extending in a first direction and a portion extending in a second direction. An orthographic projection of the driving active pattern 56 onto the substrate partially overlaps with an orthographic projection of the gate electrode of the drive transistor DTFT onto the substrate, a first terminal of the driving active pattern 56 is a first electrode of the drive transistor DTFT, and a second terminal of the driving active pattern 56 is a second electrode of the drive transistor DTFT; an orthographic projection of the first terminal of driving the active pattern 56 onto the substrate overlaps with an orthographic projection of the power source line 38 onto the substrate to form an overlapping area, at the overlapping area, the first terminal of the driving active pattern 56 is coupled to the power source line 38 through a first via hole 21, and the second terminal of the driving active pattern 56 is coupled to a first electrode of the first transistor T1.

Illustratively, an orthographic projection of the second terminal of the driving active pattern 56 onto the substrate overlaps with an orthographic projection of the second electrode plate Cst2 onto the substrate at an overlapping area, at the overlapping area, the second terminal of the driving active pattern 56 and the second electrode plate Cst2 are coupled through the second via hole 22.

As shown in FIGS. 1, 2, 7, and 9, in some embodiments, the first transistor T1 includes a first active pattern 51, the first active pattern 51 extends in the second direction; a first terminal of the first active pattern 51 is coupled to the second electrode of the drive transistor DTFT; A second terminal of the first active pattern 51 is coupled to the first light-emitting element EL1;

an orthographic projection of the second terminal of the first active pattern 51 onto the substrate is located between an orthographic projection of the first light-emitting control signal line 34 onto the substrate and an orthographic projection of the second light-emitting control signal line 35 onto the substrate.

Illustratively, the first active pattern 51 extends in the second direction, an orthographic projection of the first active pattern 51 onto the substrate partially overlaps with the orthographic projection of the first light-emitting control signal line 34 onto the substrate, the first light-emitting control signal line 34 is reused as a gate electrode of the first transistor T1, the first terminal of the first active pattern 51 is a first electrode of the first transistor T1, and the second terminal of the first active pattern 51 is a second electrode of the first transistor T1.

Illustratively, neither the first terminal nor the second terminal of the first active pattern 51 overlaps with the first light-emitting control signal line 34.

Illustratively, the first terminal of the first active pattern 51 and the second terminal of the driving active pattern 56 are formed as an integral structure.

Illustratively, the second terminal of the first active pattern 51 is coupled to an anode of the first light-emitting element EL1 through a third via hole 23.

Figure 3:
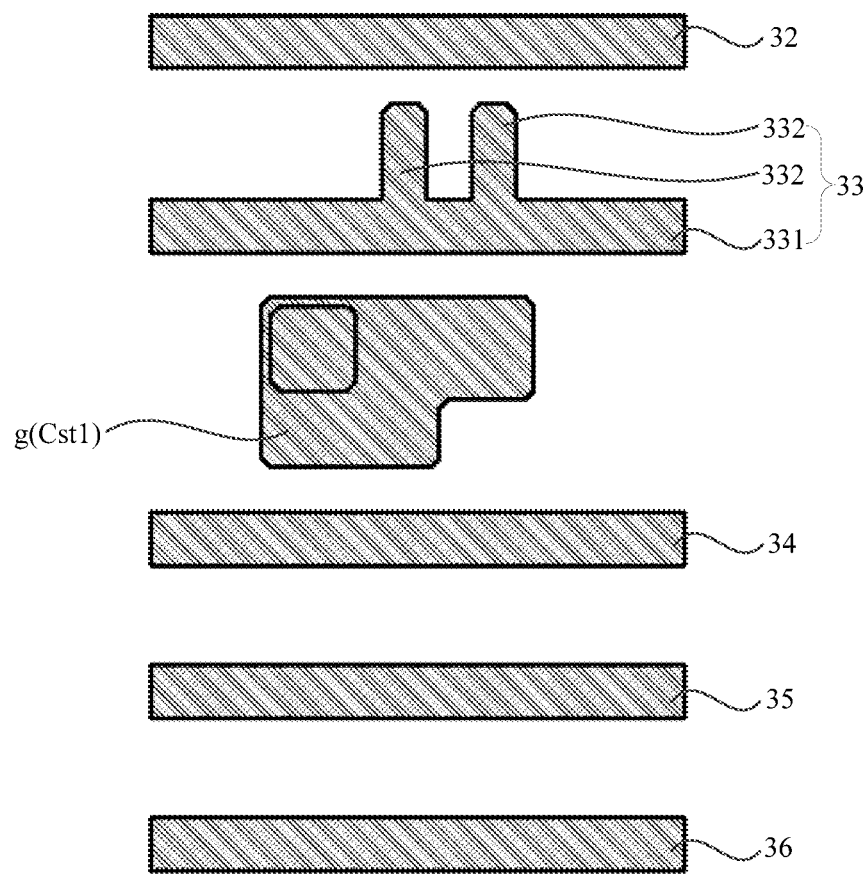
FIG. 3 is a schematic diagram of a first gate metal layer in FIG. 1.
Figure 4:
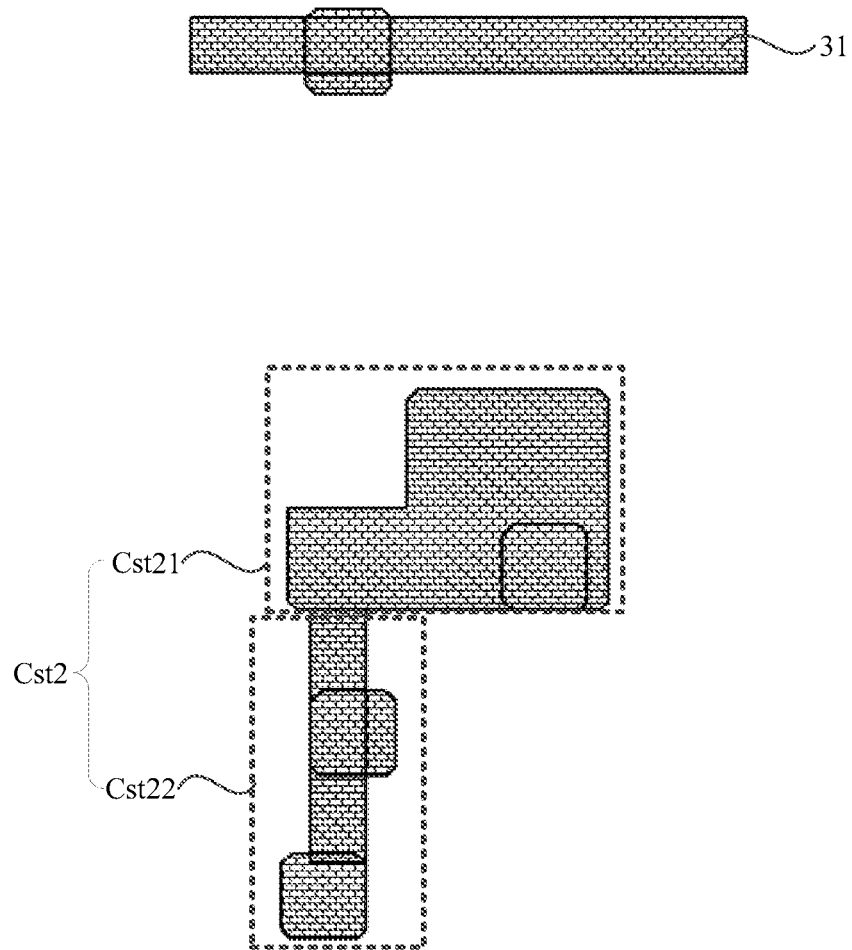
FIG. 4 is a schematic diagram of a second gate metal layer in FIG. 1.

As shown in FIGS. 1, 3 and 4, in some embodiments, the second electrode plate Cst2 includes a body portion Cst21 and an extension portion Cst22;

an orthographic projection of the body portion Cst21 onto the substrate at least partially overlaps with an orthographic projection of the gate electrode of the drive transistor DTFT onto the substrate;

the extension portion Cst22 extends in the second direction, and an orthographic projection of the extension portion Cst22 onto the substrate overlaps with an orthographic projection of the first light-emitting control signal line 34 onto the substrate, and with an orthographic projection of the second light-emitting control signal line 35 onto the substrate.

Illustratively, the body portion and the extension portion Cst22 are formed as an integral structure.

Illustratively, the body portion shaped as a block and the extension portion Cst22 shaped as a strip.

Illustratively, an orthographic projection of the second terminal of the driving active pattern 56 onto the substrate overlaps with the orthographic projection of the body portion Cst21 onto the substrate at an overlapping area, at the overlapping area, the second terminal of the driving active pattern 56 and the body portion Cst21 are coupled through a second via hole 22.

Illustratively, an orthographic projection of an end of the extension portion Cst22 away from the body portion is located between the orthographic projection of the second light-emitting control signal line 35 onto the substrate and an orthographic projection of the second reset signal line 36 onto the substrate.

As shown in FIGS. 1, 2 and 4, in some embodiments, the second transistor T2 includes a second active pattern 52, at least part of the second active pattern 52 extends in the second direction, a first terminal of the second active pattern 52 is coupled to the extension portion Cst22, and a second terminal of the second active pattern 52 is coupled to the second light-emitting element EL2;

an orthographic projection of the first terminal of the second active pattern 52 onto the substrate is located between the orthographic projection of the first light-emitting control signal line 34 onto the substrate and the orthographic projection of the second light-emitting control signal line 35 on the substrate.

Illustratively, the second active pattern 52 is in shape of "⌐".

Illustratively, the second active pattern 52 includes a first portion and a second portion of an integral structure, the first portion extending in the second direction and the second portion extending in the first direction, an orthographic projection of the first portion onto the substrate overlaps with the orthographic projection portion of the second light-emitting control signal line 35 onto the substrate.

Illustratively, the first terminal of the second active pattern 52 is the first electrode of the second transistor T2 and the second terminal of the second active pattern 52 is the second electrode of the second transistor T2. An orthographic projection of the first terminal of the second active pattern 52 onto the substrate overlaps with an orthographic projection of the extension portion Cst22 onto the substrate at an overlapping area, at the overlapping area, the first terminal of the second active pattern 52 and the extension portion Cst22 are coupled through a fourth via hole 24. The second terminal of the second active pattern 52 is coupled to an anode of the second light-emitting element EL2 through a fifth via hole 25.

Illustratively, an orthographic projection of the second terminal of the second active pattern 52 onto the substrate is located between the orthographic projection of the second light-emitting control signal line 35 onto the substrate and the orthographic projection of the second reset signal line 36 onto the substrate.

As shown in FIGS. 1 to 3, 6 and 8, in some embodiments, the pixel driving circuit further includes:

an initialization signal line 37, at least part of the initialization signal line 37 extending in the first direction;

a second reset signal line 36, at least part of the second reset signal line 36 extending in the first direction; the first reset signal line 32, the gate line 33, the first light-emitting control signal line 34, the second light-emitting control signal line 35 and the second reset signal line 36 are arranged sequentially along the second direction;

a second reset sub-circuit 14, coupled to the second reset signal line 36, the initialization signal line 37 and the extension portion Cst22.

Illustratively, the initialization signal line 37 is for providing a reference signal Vref with a fixed potential.

Illustratively, the initialization signal line 37 and the active pattern in each transistor are provided in the same layer and made by the same material.

Illustratively, the initialization signal line 37 and the gate line 33 are provided in the same layer and made by the same material.

Illustratively, the initialization signal line 37 and a second electrode plate Cst2 of the storage capacitor Cst are provided in the same layer and made by the same material.

Illustratively, an orthographic projection of the second reset signal line 36 onto the substrate is located between the orthographic projection of the second light-emitting control signal line 35 onto the substrate and an orthographic projection of the initialization signal line 37 onto the substrate.

The second reset sub-circuit 14 is capable of controlling to connect or disconnect the connection between the initialization signal line 37 and the extension portion Cst22 under the control of the second reset signal line 36.

As shown in FIGS. 1 to 3, 7 and 9, in some embodiments, the second reset sub-circuit 14 includes a fifth transistor T5, the fifth transistor T5 includes a fifth active pattern 55, the fifth active pattern 55 extends in the second direction;

a first terminal of the fifth active pattern 55 is coupled to the extension portion Cst22, and orthographic projection of the first terminal of the fifth active pattern 55 onto the substrate is located between the orthographic projection of the second light-emitting control signal line 35 onto the substrate and the orthographic projection of the second reset signal line 36 onto the substrate.

Illustratively, an orthographic projection of the fifth active pattern 55 onto the substrate overlaps with the orthographic projection of the second reset signal line 36 onto the substrate, the first terminal of the fifth active pattern 55 is a second electrode of the fifth transistor T5, and the second terminal of the fifth active pattern 55 is a first electrode of the fifth transistor T5.

Illustratively, the orthographic projection of the first terminal of the fifth active pattern 55 onto the substrate overlaps with the orthographic projection of the extension portion Cst22 onto the substrate at an overlapping area, at the overlapping area, the first terminal of the fifth active pattern 55 and the extension portion Cst22 are coupled through a sixth via hole 26.

As shown in FIG. 2, in some embodiments, the fifth active pattern 55 and the initialization signal line 37 are provided as an integral structure.

With the above-mentioned arrangement, the fifth active pattern 55 and the initialization signal line 37 can be formed in the same patterning process, which effectively simplifies the manufacturing process of the display substrate and reduces the manufacturing cost.

As shown in FIGS. 1 to 3, 7 and 9, in some embodiments, an orthographic projection of the first reset signal line 32 onto the substrate is located between the orthographic projection of the reference signal line 31 onto the substrate and the orthographic projection of the gate line 33 onto the substrate;

the first reset sub-circuit 12 includes a third transistor T3, the third transistor T3 includes a third active pattern 53, the third active pattern 53 extends in the second direction, a first terminal of the third active pattern 53 is coupled to the reference signal line 31, an orthographic projection of a second terminal of the third active pattern 53 onto the substrate is located between the orthographic projection of the first reset signal line 32 onto the substrate and the orthographic projection of the gate line 33 onto the substrate.

Illustratively, an orthographic projection of the third active pattern 53 onto the substrate partially overlaps with the orthographic projection of the first reset signal line 32 onto the substrate. The first terminal of the third active pattern 53 is a first electrode of the third transistor T3, the second terminal of the third active pattern 53 is a second electrode of the third transistor T3, and an orthographic projection of a first terminal of the third active pattern 53 onto the substrate overlaps with the orthographic projection of the reference signal line 31 onto the substrate at an overlapping area, at the overlapping area, a first terminal of the third active pattern 53 is coupled to the reference signal line 31 through a seventh via hole 27.

As shown in FIGS. 1 to 3, 7 and 9, in some embodiments, the gate line 33 includes a gate body portion 331 and two gate protruding portions 332, the gate body portion 331 extends in the first direction, and the two gate protruding portions 332 are provided at an interval in the first direction, where the two gate protruding portions 332 are located between the gate body portion 331 and the first reset signal line 32;

the data writing sub-circuit 13 includes a fourth transistor T4, the fourth transistor T4 includes a fourth active pattern 54, the fourth active pattern 54 extends in a first direction, and an orthographic projection of the fourth active pattern 54 onto the substrate overlaps with orthographic projections of the two gate protruding portions 332 onto the substrate, respectively;

a first terminal of the fourth active pattern 54 is coupled to the data line 39, and a second terminal of the fourth active pattern 54 is coupled to a second terminal of the third active pattern 53.

Illustratively, the gate body portion 331 and the two gate protruding portions 332 are formed as an integral structure.

Illustratively, the gate protruding portion 332 extends in the second direction.

Illustratively, the orthographic projection of the two gate protruding portions 332 onto the substrate is located between the orthographic projection of the gate body portion 331 onto the substrate and the orthographic projection of the first reset signal line 32 onto the substrate.

Illustratively, the two gate protruding portions 332 are reused as a gate electrode of the fourth transistor T4, and the fourth transistor T4 is a double-gate structure.

Illustratively, the fourth transistor T4 may also be formed as an ordinary structure having only one gate electrode.

Illustratively, the first terminal of the fourth active pattern 54 is a first electrode of the fourth transistor T4 and the second terminal of the fourth active pattern 54 is a second electrode of the fourth transistor T4.

Illustratively, an orthographic projection of the first terminal of the fourth active pattern 54 onto the substrate overlaps with the orthographic projection of the data line 39 onto the substrate at an overlapping area, at the overlapping area, the first terminal of the fourth active pattern 54 and the data line 39 are coupled through an eighth via hole 28.

Illustratively, the second terminal of the fourth active pattern 54 and the second terminal of the third active pattern 53 are formed as an integral structure.

Illustratively, the third active pattern 53 and the fourth active pattern 54 together forms a shape "L".

It should be noted that there may be various types for the first transistor T1, the second transistor T2, the third transistor T3, the fourth transistor T4, the fifth transistor T5 and the drive transistor DTFT, and illustratively, NMOS transistors are used.

Figure 11:
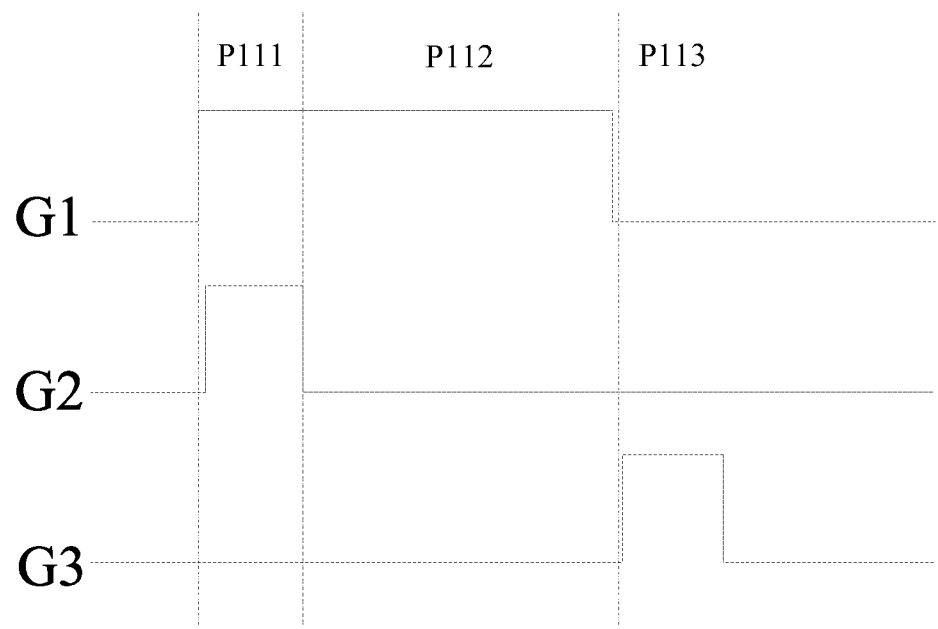
FIG. 11 is an operating timing diagram during a signal writing period provided by embodiments of the present disclosure.

In a case that the pixel driving circuit includes the first transistor T1, the second transistor T2, the third transistor T3, the fourth transistor T4, the fifth transistor T5 and the drive transistor DTFT, as shown in FIG. 11, the operating process of the pixel driving circuit during a signal writing period is as follows.

In a P111 stage of the signal writing period, under the control of a first reset signal G1 written by the first reset signal line 32, the third transistor T3 is turned on, and a reference signal Vref is written to a gate electrode (namely, g point) of the drive transistor DTFT; under the control of a second reset signal G2 written by the second reset signal line 36, the fifth transistor T5 is turned on, and an initialization signal Vint is written to the source electrode (namely, s point) of the drive transistor DTFT.

In a P112 stage of the signal writing period, the voltage of the reference signal Vref is higher than the voltage of initialization signal Vint, the drive transistor DTFT is turned on, and the voltage of s point rises; when the voltage of s point rises to Vref−Vth, where Vth is the threshold voltage of the drive transistor DTFT, for the drive transistor DTFT, Vgs−Vth=0, and the Vgs is the voltage difference between the gate electrode and the source electrode of the drive transistor DTFT, so that the drive transistor DTFT is switched off.

In a P113 stage of the signal writing period, under the control of a scanning signal G3 written by the gate line 33, the fourth transistor T4 is turned on, and the data signal DA transmitted by the data line 39 is written to the g point; due to the coupling effect of the storage capacitor Cst and the inherent capacitance Coled of the OLED itself, the voltage of s point changes to Vref−Vth+a (Vdata−Vref), where a=C1/(C1+Coled), C1 is the capacitance value of the storage capacitor Cst, and Vdata is the voltage value of the data signal DA. The final driving current flowing through the drive transistor DTFT is I=k*(Vgs−Vth)^2=k*[(1−a)*(Vdata−Vref)]^2, and the value of the driving current is independent of Vth, so as to realize the compensation for Vth.

Figure 5:
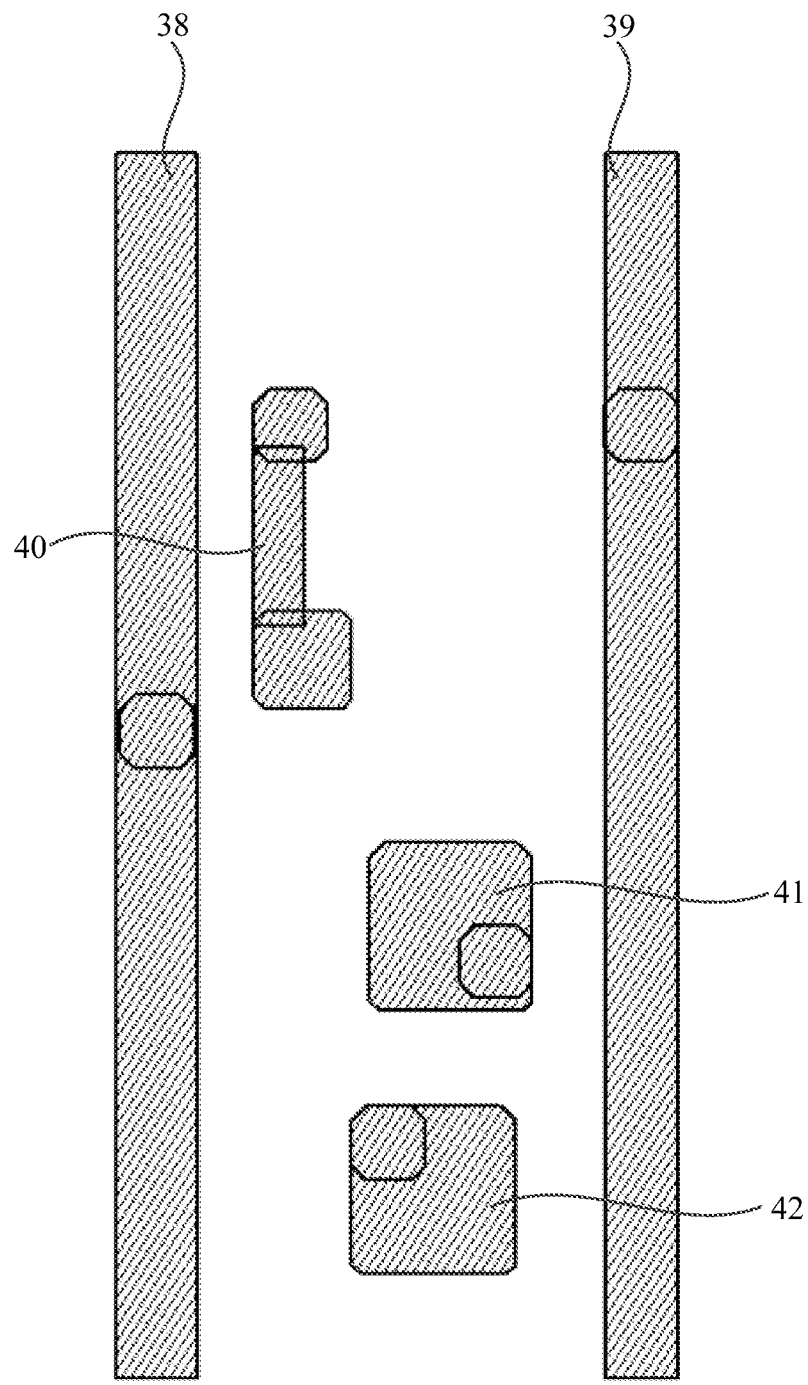
FIG. 5 is a schematic diagram of a first source and drain metal layer in FIG. 1.

As shown in FIGS. 1 and 5, in some embodiments, the pixel driving circuit includes a conductive connection portion 40, at least part of conductive connection portion 40 extends in the second direction, an orthographic projection of the conductive connection portion 40 onto the substrate partially overlaps with the orthographic projection of the gate line 33 onto the substrate;

a first terminal of the conductive connection portion 40 is coupled to a second terminal of the third active pattern 53, and a second terminal of the conductive connection portion 40 is coupled to a control terminal of the driving sub-circuit 10.

Illustratively, an orthographic projection of the first terminal of the conductive connection portion 40 onto the substrate overlaps with an orthographic projection of a second terminal of the third active pattern 53 onto the substrate, where the first terminal of the conductive connection portion 40 and the second terminal of the third active pattern 53 are coupled through a ninth via hole 29. An orthographic projection of the second terminal of the conductive connection portion 40 onto the substrate overlaps with an orthographic projection of the gate electrode of the drive transistor DTFT onto the substrate, and the second terminal of the conductive connection portion 40 is coupled to the gate electrode of the drive transistor DTFT through the tenth via hole 20.

Illustratively, an orthographic projection of the conductive connection portion 40 onto the substrate does not overlap with an orthographic projection of the second electrode plate Cst2 onto the substrate.

It should be noted that the display substrate display substrate includes, in a direction away from the substrate, an active layer, a first gate insulating layer, a first gate metal layer, a second gate insulating layer, a second gate metal layer, a interlayer insulating layer, a first source and drain metal layer, a planarization layer and the like which are stacked in the sequence listed.

Illustratively, the active layer is for forming active patterns included in various transistors, and an initialization signal line 37; the first gate metal layer is for forming the first reset signal line 32, the gate electrode, the first light-emitting control signal line 34, the second light-emitting control signal line 35 and the second reset signal line 36; the second gate metal layer is for forming the reference signal line 31, the second electrode plate Cst2 and some of the conductive connection portions 40; the first source and drain metal layer is for forming the power source line 38, the data line 39 and some of the conductive connection portions 40.

It should be noted that the first via hole 21 to the tenth via hole 20 may penetrate through one or more film layers.

A second electrode of the first transistor T1 and a second electrode of the second transistor T2 may be coupled to an anode of a corresponding light-emitting element through a corresponding via hole and connection portions (e. g. numerals 41 and 42) formed by the second gate metal layer and the first source and drain metal layer.

In the display substrate provided by the above-mentioned embodiments, by adopting the above-mentioned layout, the layout space can be effectively used to achieve an optimized resolution of the display substrate.

The embodiments of the present disclosure also provide a display device, including the display substrate provided by embodiments described above.

In the display substrate provided by the above-mentioned embodiments, at least two sub-pixels can share one pixel driving circuit, and the pixel driving circuit can control, independently, the light-emitting elements included in sub-pixels from the at least two sub-pixels, to emit light independently or to emit light simultaneously. Therefore, in the display substrate provided by the above-mentioned embodiments, a high resolution display can be realized in case of arranging a limited number of pixel driving circuits.

The display device provided by embodiments of the present disclosure, including the above-mentioned display substrate, also has the above-mentioned advantageous effects, and will not be described in detail herein.

It should be noted that the display device may be: any product or component with display function such as television, display, digital photo frame, mobile phone and tablet computer.

In some embodiments, at least two light-emitting control signal lines in the display substrate include a first light-emitting control signal line 34 and a second light-emitting control signal line 35; at least two light-emitting control sub-circuits include a first light-emitting control sub-circuit 15 and a second light-emitting control sub-circuit 16; at least two light-emitting elements include a first light-emitting element EL1 and a second light-emitting element EL2;

a plurality of pixel driving circuits included in a plurality of sub-pixel groups in the display substrate are arranged in an array, the plurality of pixel driving circuits are divided into a plurality of rows of pixel driving circuits arranged in the second direction, first light-emitting control signal lines 34 in rows of pixel driving circuits are sequentially coupled, and second light-emitting control signal lines 35 in rows of pixel driving circuit are sequentially coupled;

the display device further includes: a gate driving circuit located in a peripheral region of the display substrate, where the gate driving circuit includes a plurality of first shift register units and a plurality of second shift register units; the plurality of first shift register units is in one-to-one correspondence with the plurality of rows of pixel driving circuits, and the plurality of second shift register units is in one-to-one correspondence with the plurality of rows of pixel driving circuits;

an output terminal of a first shift register unit is coupled to a first light-emitting control signal line 34 in a corresponding row of pixel driving circuit, and an output terminal of a second shift register unit is coupled to a second light-emitting control signal line 35 in a corresponding row of pixel driving circuit.

Illustratively, in the display substrate, a plurality of pixel driving circuits included in a plurality of sub-pixel groups are arranged in an array, and the plurality of pixel driving circuits can be divided into a plurality of rows of pixel driving circuits and a plurality of columns of pixel driving circuits.

The plurality of rows of pixel driving circuits are arranged sequentially in the second direction, and each row of pixel driving circuit includes a plurality of pixel driving circuits arranged in the first direction. The plurality of columns of pixel driving circuits are sequentially arranged in the first direction, and each column of pixel driving circuit includes a plurality of pixel driving circuits arranged in the second direction.

In the same row of pixel driving circuits, the reference signal lines 31 are sequentially coupled to form an integral structure, the first reset signal lines 32 are sequentially coupled to form an integral structure, the gate lines 33 are sequentially coupled to form an integral structure, the first light-emitting control signal lines 34 are sequentially coupled to form an integral structure, the second light-emitting control signal lines 35 are sequentially coupled to form an integral structure, the second reset signal lines 36 are sequentially coupled to form an integral structure, and the initialization signal lines 37 are sequentially coupled to form an integral structure.

In the same column of pixel driving circuit, the power source lines 38 are sequentially coupled to form an integral structure, and the data lines 39 are sequentially coupled to form an integral structure.

Figure 12:
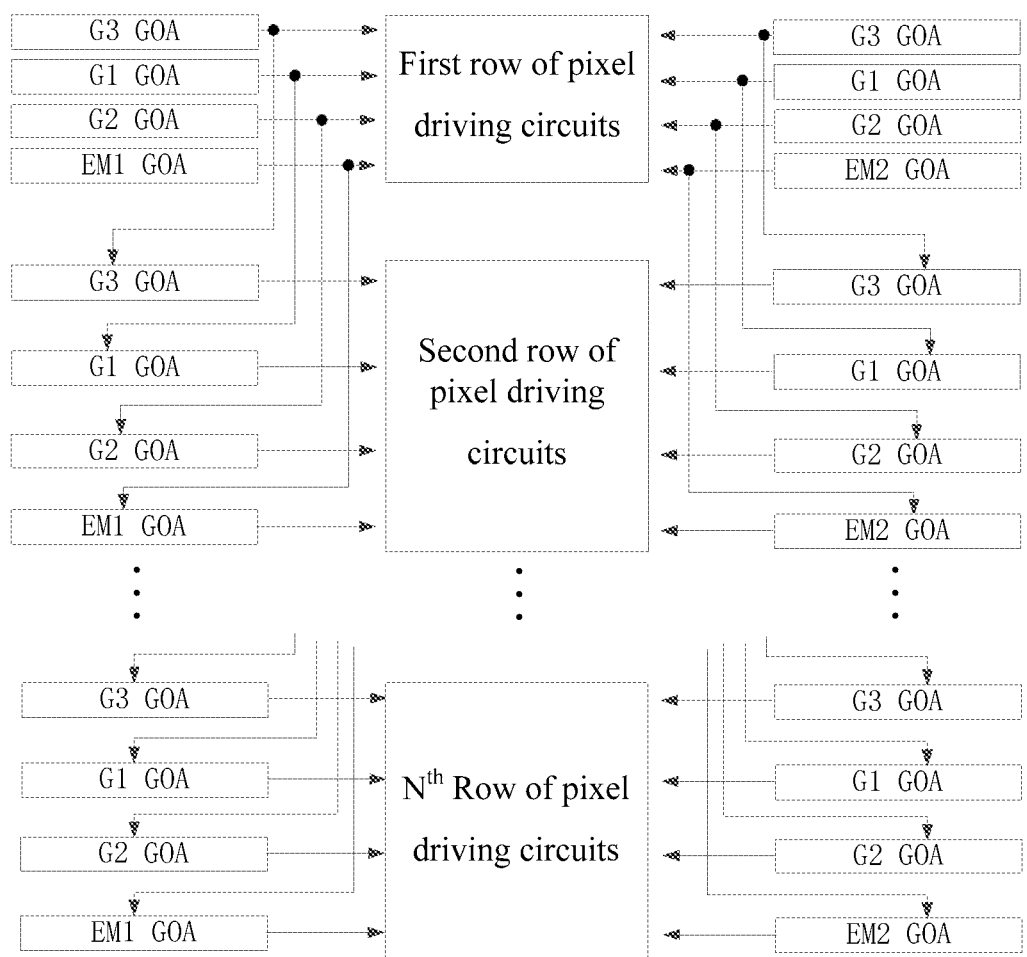
FIG. 12 is a schematic diagram of a gate driving circuit provided by embodiments of the present disclosure.

As shown in FIG. 12, illustratively, the gate driving circuit includes a plurality of first shift register units EM1 GOA and a plurality of second shift register units EM2 GOA; the plurality of first shift register units is in one-to-one correspondence with the plurality of rows of pixel driving circuits, and the plurality of second shift register units is in one-to-one correspondence with the plurality of rows of pixel driving circuits; an output terminal of a first shift register unit is coupled to a first light-emitting control signal line 34 in a corresponding row of pixel driving circuits, and an output terminal of a second shift register unit is coupled to a second light-emitting control signal line 35 in a corresponding row of pixel driving circuit.

Illustratively, the gate driving circuit includes a plurality of third shift register units G3 GOA, the plurality of third shift register units is in one-to-one correspondence with the plurality of rows of the pixel driving circuits, and an output terminal of a third shift register unit is coupled to a gate line 33 in a corresponding row of the pixel driving circuit.

Illustratively, the gate driving circuit includes a plurality of fourth shift register units G1 GOA, the plurality of fourth shift register units is in one-to-one correspondence with the plurality of rows of pixel driving circuits, and an output terminal of a fourth shift register unit is coupled to a first reset signal line 32 in a corresponding row of pixel driving circuit.

Illustratively, the gate driving circuit includes a plurality of fifth shift register units G2 GOA, the plurality of fifth shift register units is in one-to-one correspondence with the plurality of rows of pixel driving circuits, and an output terminal of a fifth shift register unit is coupled to a second reset signal line 36 in a corresponding row of pixel driving circuit.

Illustratively, shift register units corresponding to a row of pixel driving circuits can be arranged at one side of the display substrate, namely, to achieve a single-side driving; alternatively, shift register units corresponding to a row of pixel driving circuits may be provided on both sides of the display substrate, namely, to achieve a double-side driving.

Illustratively, the gate driving circuit includes N first shift register units EM1 GOA, and the N first shift register units EM1 GOA are cascaded; namely, an output terminal of the (N−1)th first shift register unit EM1 GOA is coupled to a first light-emitting control signal line 34 in a corresponding row of pixel driving circuit. The output terminal of the (N−1)th first shift register unit EM1 GOA is also coupled to an input signal terminal of the Nth first shift register unit EM1 GOA; the (N−1)th first shift register unit EM1 GOA simultaneously writes a first light-emitting control signal to the first light-emitting control signal line 34 in the corresponding row of pixel driving circuits, and to the input signal terminal of the Nth first shift register unit EM1 GOA writes.

Likewise, the plurality of second shift register units EM2 GOA, the plurality of third shift register units G3 GOA, the plurality of fourth shift register units G1 GOA, and the plurality of fifth shift register units G2 GOA all meet the above-mentioned cascade relationship, which will not be described in detail herein.

Figure 6:
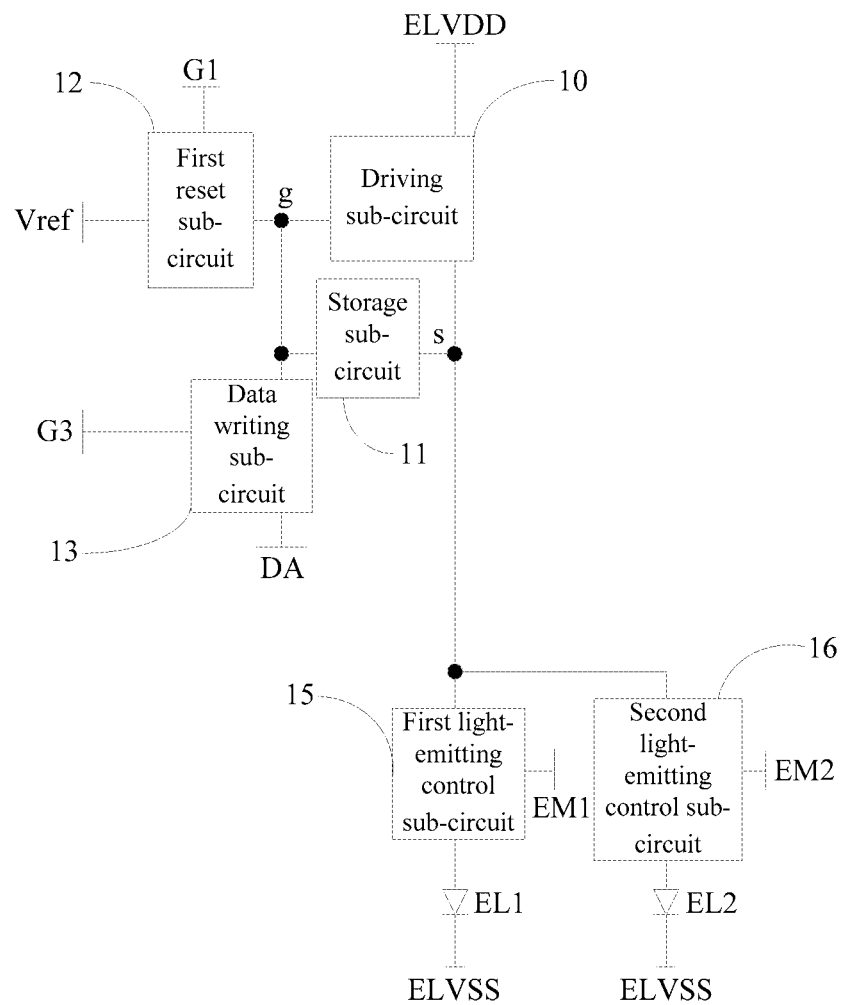
FIG. 6 is a first basic structure diagram of a pixel driving circuit provided by embodiments of the present disclosure.

As shown in FIG. 6, embodiments of the present disclosure also provide a pixel driving circuit, configured to drive at least two light-emitting elements to emit light, the pixel driving circuit including:

a driving sub-circuit 10, where a first terminal of the driving sub-circuit 10 is coupled to a first level signal input terminal;

a storage sub-circuit 11, a first terminal of the storage sub-circuit 11 is coupled to a control terminal of the driving sub-circuit 10, and a second terminal of the storage sub-circuit 11 is coupled to a second terminal of the driving sub-circuit 10;

a first reset sub-circuit 12, coupled to a first reset signal input terminal, a reference signal input terminal and a control terminal of the driving sub-circuit 10;

a data writing sub-circuit 13, coupled to a scanning signal input terminal, a data signal input terminal and the control terminal of the driving sub-circuit 10; and at least two light-emitting control sub-circuits, where the at least two light-emitting control sub-circuits are in one-to-one correspondence with the at least two light-emitting elements, and the at least two light-emitting control sub-circuits are in one-to-one correspondence with at least two control signal output terminals; each of the light-emitting control sub-circuits is coupled to the second terminal of the driving sub-circuit 10, a corresponding control signal output terminal and a corresponding light-emitting element; each of the light-emitting control sub-circuits is configured to control to connect or disconnect a connection between the second terminal of the driving sub-circuit 10 and the corresponding light-emitting element under the control of the corresponding control signal output terminal.

In some embodiments, the at least two light-emitting elements include a first light-emitting element EL1 and a second light-emitting element EL2; the at least two control signal output terminals include a first control signal output terminal and a second control signal output terminal; the at least two light-emitting control sub-circuits include a first light-emitting control sub-circuit 15 and a second light-emitting control sub-circuit 16;

the first light-emitting control sub-circuit 15 is coupled to the second terminal of the driving sub-circuit 10, the first control signal output terminal and the first light-emitting element EU; the first light-emitting control sub-circuit 15 is configured for controlling to connect or disconnect the connection between the second terminal of the driving sub-circuit 10 and the first light-emitting element EL1 under the control of the first control signal output terminal;

the second light-emitting control sub-circuit 16 is coupled to the second terminal of the driving sub-circuit 10, the second control signal output terminal and the second light-emitting element EL2; the second light-emitting control sub-circuit 16 is configured for controlling to connect or disconnect the connection between the second terminal of the driving sub-circuit 10 and the second light-emitting element EL2 under the control of the second control signal output terminal.

Figure 7:
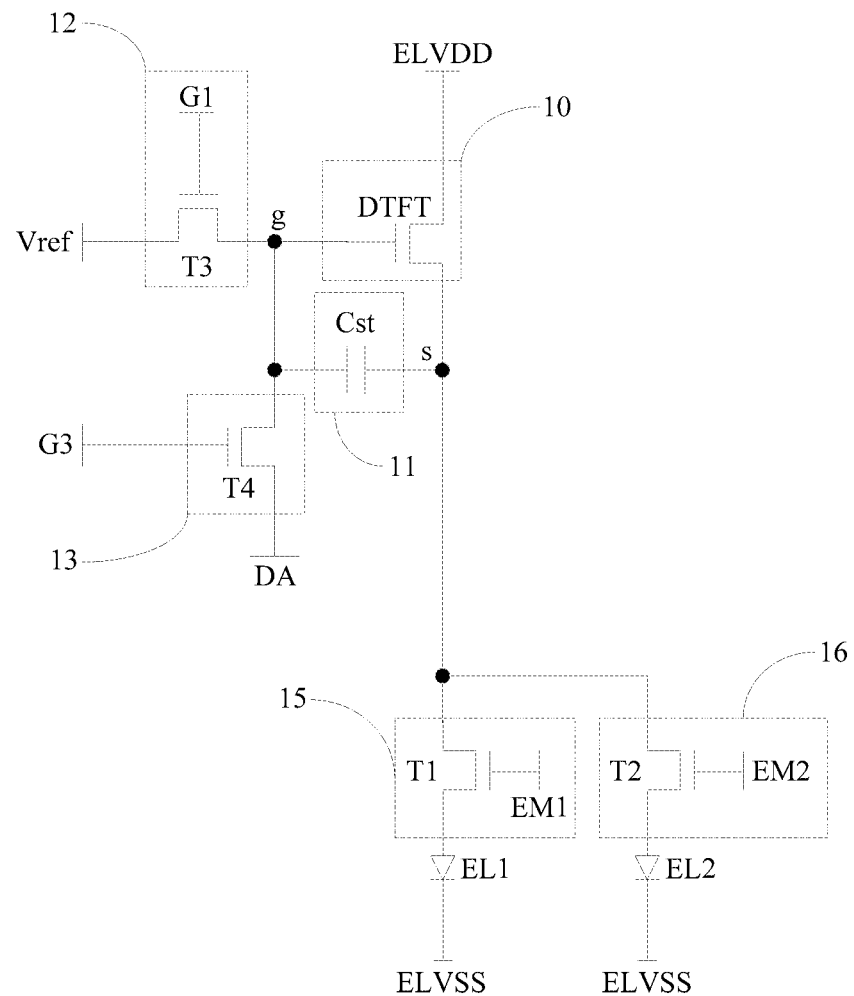
FIG. 7 is a first specific structure diagram of a pixel driving circuit provided by embodiments of the present disclosure.

As shown in FIG. 7, in some embodiments, the first light-emitting control sub-circuit 15 includes a first transistor T1, a gate electrode of the first transistor T1 is coupled to the first control signal output terminal, a first electrode of the first transistor T1 is coupled to a second terminal of the driving sub-circuit 10, and a second electrode of the first transistor T1 is coupled to the first light-emitting element EL1.

As shown in FIG. 7, in some embodiments, the second light-emitting control sub-circuit 16 includes a second transistor T2, a gate electrode of the second transistor T2 is coupled to the second control signal output terminal, a first electrode of the second transistor T2 is coupled to a second terminal of the driving sub-circuit 10, and a second electrode of the second transistor T2 is coupled to the second light-emitting element EL2.

As shown in FIG. 7, in some embodiments, the driving sub-circuit 10 includes a drive transistor DTFT, and a first electrode of the drive transistor DTFT is coupled to the first level signal input terminal;

the storage sub-circuit 11 includes a storage capacitor Cst, a first electrode plate Cst1 of the storage capacitor Cst is coupled to a gate electrode of the drive transistor DTFT, and a second electrode plate Cst2 of the storage capacitor Cst is coupled to a second electrode of the drive transistor DTFT;

the first reset sub-circuit 12 includes a third transistor T3, a gate electrode of the third transistor T3 is coupled to the first reset signal input terminal, a first electrode of the third transistor T3 is coupled to the reference signal input terminal, and a second electrode of the third transistor T3 is coupled to a gate electrode of the drive transistor DTFT;

the data writing sub-circuit 13 includes a fourth transistor T4, a gate electrode of the fourth transistor T4 is coupled to the scanning signal input terminal, a first electrode of the fourth transistor T4 is coupled to the data signal input terminal, and a second electrode of the fourth transistor T4 is coupled to the gate electrode of the drive transistor DTFT.

Figure 8:
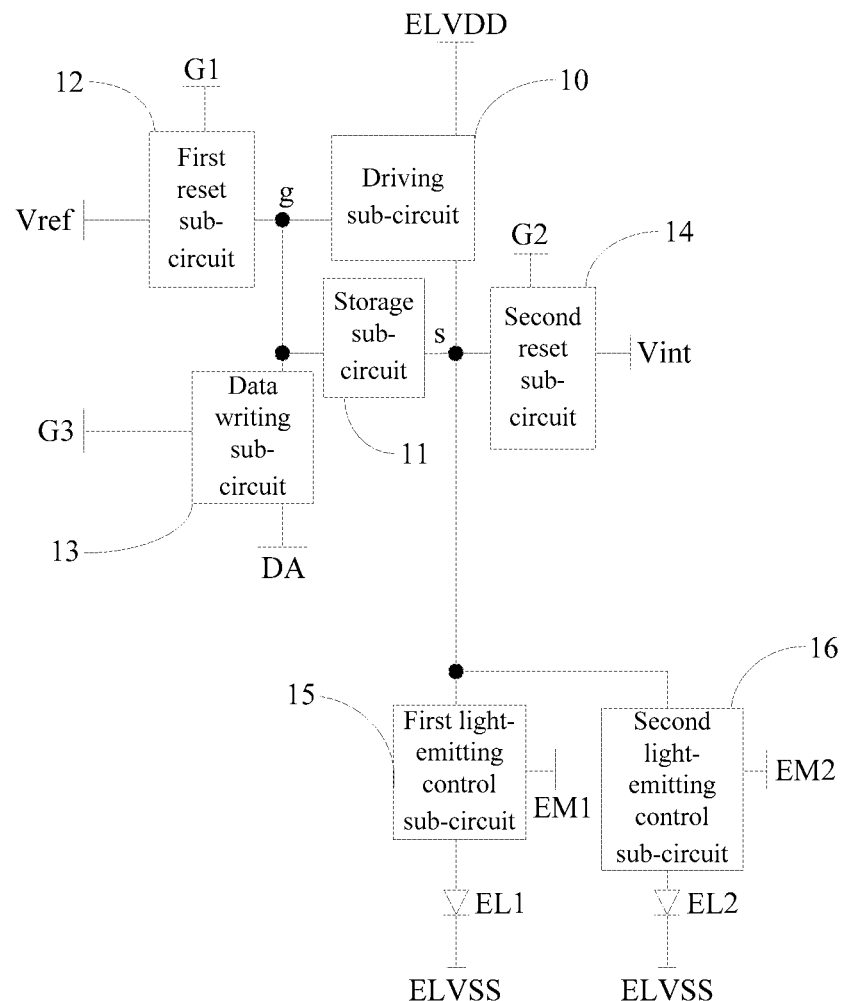
FIG. 8 is a second basic structure diagram of a pixel driving circuit provided by embodiments of the present disclosure.

As shown in FIG. 8, in some embodiments, the pixel driving circuit further includes:

a second reset sub-circuit 14, coupled to a second reset signal input terminal, an initialization signal input terminal and a second terminal of the driving sub-circuit 10; the second reset sub-circuit 14 is configured for, under the control of the second reset signal input terminal, controlling to connect or disconnect the connection between the initialization signal input terminal and the second terminal of the driving sub-circuit 10.

Figure 9:
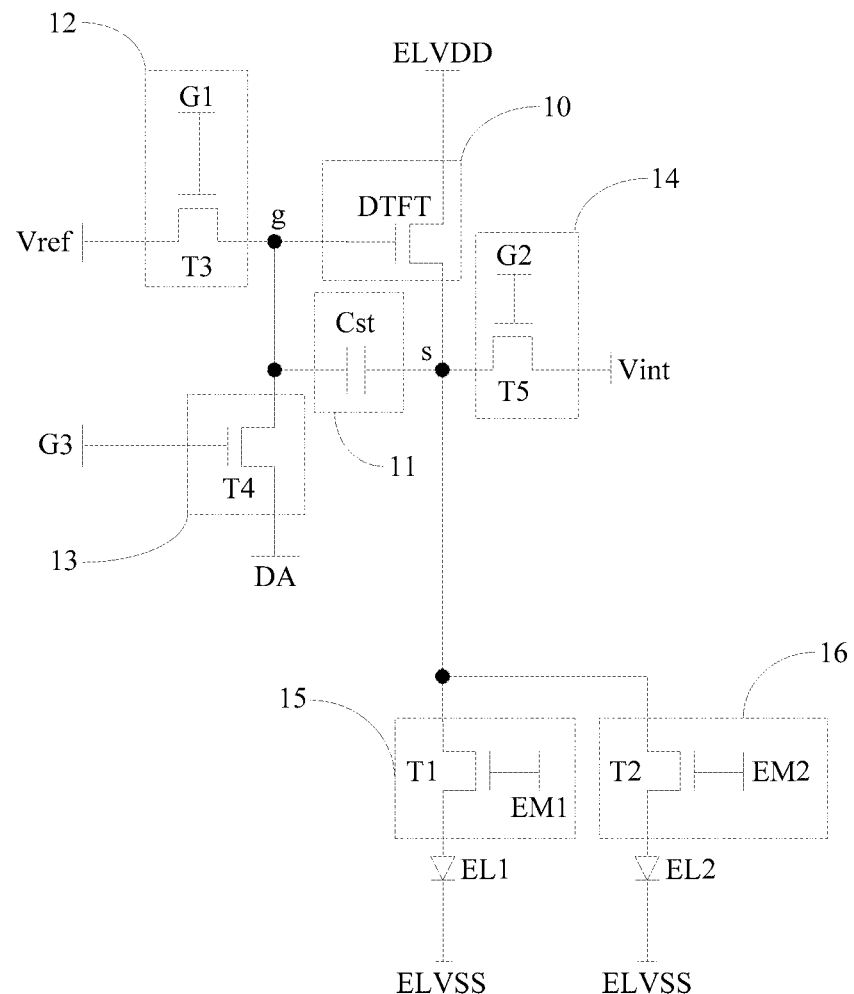
FIG. 9 is a second specific structure diagram of a pixel driving circuit provided by embodiments of the present disclosure.

As shown in FIG. 9, in some embodiments, the second reset sub-circuit 14 includes a fifth transistor T5, a gate electrode of the fifth transistor T5 is coupled to the second reset signal input terminal, a first electrode of the fifth transistor T5 is coupled to the initialization signal input terminal, and a second electrode of the fifth transistor T5 is coupled to a second terminal of the driving sub-circuit 10.

The embodiments of the present disclosure also provide a driving method for a pixel driving circuit, where, the method is for driving the pixel driving circuit provided by the above-mentioned embodiments, and the driving method includes:

controlling, in a light-emitting stage by at least two control signal output terminals, at least two corresponding light-emitting control sub-circuits, to cause each of the light-emitting control sub-circuits to control to connect or disconnect a connection between a second terminal of a driving sub-circuit 10 and a corresponding light-emitting element.

In some embodiments, at least two light-emitting elements include a first light-emitting element EL1 and a second light-emitting element EL2; the at least two control signal output terminals include a first control signal output terminal and a second control signal output terminal; the at least two light-emitting control sub-circuits include a first light-emitting control sub-circuit 15 and a second light-emitting control sub-circuit 16; and the method further comprise: controlling, in a first light-emitting stage by the first light-emitting control sub-circuit 15, to disconnect a connection between an second terminal of the driving sub-circuit 10 and the first light-emitting element EL1 under the control of the first control signal output terminal; and controlling, in the first light-emitting stage by the second light-emitting control sub-circuit 16, to disconnect the connection between the second terminal of the driving sub-circuit 10 and the second light-emitting element EL2 under the control of the second control signal output terminal;

controlling, in a second light-emitting stage by the first light-emitting control sub-circuit 15, to disconnect the connection between the second terminal of said driving sub-circuit 10 and the first light-emitting element EL1 under the control of the first control signal output terminal; and controlling, in the second light-emitting stage by the second light-emitting control sub-circuit 16, to disconnect the connection between the second terminal of the driving sub-circuit 10 and the second light-emitting element EL2 under the control of the second control signal output terminal.

It should be noted that various embodiments in this specification is described in a progressive manner, the same and similar parts between various embodiments can be referred to each other, and each embodiment focuses on the differences from other embodiments. In particular, with regard to the method embodiment, since it is substantially similar to the product embodiment, the description thereof is relatively simple, and reference can be made to description of the product embodiment for the relevant part.

Unless defined otherwise, technical or scientific terms used in the present disclosure shall have the ordinary meaning as understood by one of ordinary skill in the art to which this disclosure belongs. The use of "first", "second", and the like in this disclosure does not denote any order, quantity, or importance, but rather is used to distinguish one element from another. The word "include" or "comprise", and the like, means that the presence of an element or item preceding the word encompasses the presence of the element or item listed after the word and equivalents thereof, but does not exclude other elements or items. The terms "connect", "couple", or "link", and the like, are not limited to physical or mechanical connections, but may include electrical connections, whether direct or indirect. The terms "upper", "lower", "left", "right", etc. are used only to indicate a relative position relationship, which may change accordingly when the absolute position of the described object changes.

It will be understood that when an element such as a layer, film, region, or substrate is referred to as being "on" or "under" another element, it can be "directly on" or "directly under" the other element or intervening elements may be present.

In the description of the above embodiments, particular features, structures, material or characteristics may be combined in any suitable manner in any one or more embodiments or examples.

The above description is only specific implementations of the present disclosure, but the protection scope of the present disclosure is not limited thereto, and changes or substitutions that can be readily envisaged by those skilled in the art after reading the present disclosure, should be included in the protection scope of the present disclosure. Accordingly, the protection scope of the present disclosure is set forth in the appended claims.

What is claimed is:

1. A display substrate, comprising a substrate and a plurality of sub-pixels provided on the substrate, each sub-pixel comprising a light-emitting element;
    wherein the plurality of sub-pixels is divided into a plurality of sub-pixel groups, the plurality of sub-pixel groups each comprises at least two sub-pixels, the at least two sub-pixels share the same pixel driving circuit, and the pixel driving circuit comprises:
    at least two light-emitting control signal lines, at least part of each of the at least two light-emitting control signal lines extending in a first direction, and the at least two light-emitting control signal lines being arranged in a second direction, the second direction intersecting with the first direction;
    a compensation driving sub-circuit, an output terminal of the compensation driving sub-circuit being configured to output a driving signal;
    at least two light-emitting control sub-circuits, wherein the at least two light-emitting control sub-circuits correspond to at least two light-emitting elements comprised in the at least two sub-pixels, the at least two light-emitting control sub-circuits correspond to the at least two light-emitting control signal lines, and each of the at least two light-emitting control sub-circuits is directly coupled to the output terminal of the compensation driving sub-circuit, a corresponding light-emitting element and a corresponding light-emitting control signal line; each of the at least two light-emitting control sub-circuits is configured to control to a connection between the output terminal of the compensation driving sub-circuit and the corresponding light-emitting element to be connected or disconnected under the control of the corresponding light-emitting control signal line;
    a second reset sub-circuit comprising a fifth transistor with a fifth active pattern, wherein the fifth active pattern is directly coupled to the at least two light-emitting control sub-circuits and directly coupled to a storage sub-circuit.

2. The display substrate of claim 1, wherein the pixel driving circuit further comprises:

a reference signal line, at least part of the reference signal line extending in the first direction;
a first reset signal line, at least part of the first reset signal line extending in the first direction;
a gate line, at least part of the gate line extending in the first direction;
a power source line, at least part of the power source line extending in a second direction; and,
a data line, at least part of the data line extending in the second direction;
wherein the compensation driving sub-circuit comprises:
a driving sub-circuit, a first terminal of the driving sub-circuit is coupled to the power source line, and a second terminal of the driving sub-circuit is the output terminal of the compensation driving sub-circuit;
the storage sub-circuit, a first terminal of the storage sub-circuit is coupled to a control terminal of the driving sub-circuit, and a second terminal of the storage sub-circuit is coupled to the second terminal of the driving sub-circuit;
a first reset sub-circuit, coupled to the first reset signal line, the reference signal line and the control terminal of the driving sub-circuit; and
a data writing sub-circuit, coupled to the gate line, the data line and the control terminal of the driving sub-circuit.

3. The display substrate of claim 2, wherein the at least two light-emitting control signal lines comprise a first light-emitting control signal line and a second light-emitting control signal line; the at least two light-emitting control sub-circuits comprise a first light-emitting control sub-circuit and a second light-emitting control sub-circuit; the at least two light-emitting elements comprise a first light-emitting element and a second light-emitting element;
the first light-emitting control sub-circuit is coupled to the second terminal of the driving sub-circuit, the first light-emitting control signal line and the first light-emitting element; the second light-emitting control sub-circuit is coupled to the second terminal of the driving sub-circuit, the second light-emitting control signal line, and the second light-emitting element.

4. The display substrate of claim 3, wherein the first light-emitting control sub-circuit comprises a first transistor, the second light-emitting control sub-circuit comprises a second transistor, and the driving sub-circuit comprises a drive transistor; the storage sub-circuit comprises a storage capacitor;
a gate electrode of the drive transistor is reused as a first electrode plate of the storage capacitor;
a second electrode plate of the storage capacitor is located at a side of the first electrode plate facing away from the substrate, and the second electrode plate is coupled to a second electrode of the drive transistor;
a first electrode of the first transistor is coupled to the second electrode of the drive transistor, and a second electrode of the first transistor is coupled to the first light-emitting element;
a first electrode of the second transistor is coupled to the second electrode plate, and a second electrode of the second transistor is coupled to the second light-emitting element.

5. The display substrate of claim 4, wherein the first transistor comprises a first active pattern, the first active pattern extends in the second direction; a first terminal of the first active pattern is coupled to the second electrode of the drive transistor; a second terminal of the first active pattern is coupled to the first light-emitting element;
an orthographic projection of the second terminal of the first active pattern onto the substrate is located between an orthographic projection of the first light-emitting control signal line onto the substrate and an orthographic projection of the second light-emitting control signal line onto the substrate.

6. The display substrate of claim 4, wherein the second electrode plate comprises a body portion and an extension portion;
an orthographic projection of the body portion onto the substrate at least partially overlaps with an orthographic projection of the gate electrode of the drive transistor onto the substrate;
the extension portion extends in the second direction, and an orthographic projection of the extension portion onto the substrate overlaps with an orthographic projection of the first light-emitting control signal line onto the substrate and an orthographic projection of the second light-emitting control signal line onto the substrate.

7. The display substrate of claim 6, wherein the second transistor comprises a second active pattern, at least part of the second active pattern extends in the second direction, a first terminal of the second active pattern is coupled to the extension portion, a second terminal of the second active pattern is coupled to the second light-emitting element;
an orthographic projection of the first terminal of the second active pattern onto the substrate is located between the orthographic projection of the first light-emitting control signal line onto the substrate and the orthographic projection of the second light-emitting control signal line onto the substrate.

8. The display substrate of claim 6, wherein the pixel driving circuit further comprises:
an initialization signal line, at least part of the initialization signal line extending in the first direction;
a second reset signal line, at least part of the second reset signal line extending in the first direction; the first reset signal line, the gate line, the first light-emitting control signal line, the second light-emitting control signal line and the second reset signal line are arranged successively in the second direction;
wherein the second reset sub-circuit is coupled to the second reset signal line, the initialization signal line and the extension portion.

9. The display substrate of claim 8, wherein the fifth active pattern extends in the second direction;
a first terminal of the fifth active pattern is coupled to the extension portion, and an orthographic projection of the first terminal of the fifth active pattern onto the substrate is located between the orthographic projection of the second light-emitting control signal line onto the substrate and an orthographic projection of the second reset signal line onto the substrate.

10. The display substrate of claim 9, wherein the fifth active pattern and the initialization signal line are formed as an integral structure.

11. The display substrate according to claim 2, wherein an orthographic projection of the first reset signal line onto the substrate is located between an orthographic projection of the reference signal line onto the substrate and an orthographic projection of the gate line onto the substrate;
the first reset sub-circuit comprises a third transistor, the third transistor comprises a third active pattern, the third active pattern extends in the second direction, a first terminal of the third active pattern is coupled to the reference signal line, an orthographic projection of a second terminal of the third active pattern onto the substrate is located between the orthographic projection of the first reset signal line onto the substrate and the orthographic projection of the gate line onto the substrate.

12. The display substrate according to claim 11, wherein the gate line comprises a gate body portion and two gate protruding portions, the gate body portion extends in the first direction, the two gate protruding portions are provided at an interval in the first direction, the two gate protruding portions are located between the gate body portion and the first reset signal line;
the data writing sub-circuit comprises a fourth transistor, the fourth transistor comprises a fourth active pattern, the fourth active pattern extends in the first direction, and an orthographic projection of the fourth active pattern onto the substrate overlaps with orthographic projections of the two gate protruding portions onto the substrate, respectively;
a first terminal of the fourth active pattern is coupled to the data line, and a second terminal of the fourth active pattern is coupled to the second terminal of the third active pattern.

13. The display substrate of claim 12, wherein the pixel driving circuit comprises a conductive connection portion, at least part of the conductive connection portion extends in the second direction, an orthographic projection of the conductive connection portion onto the substrate overlaps with the orthographic projection of the gate line onto the substrate;
a first terminal of the conductive connection portion is coupled to the second terminal of the third active pattern and a second terminal of the conductive connection portion is coupled to the control terminal of the driving sub-circuit.

14. A display device, comprising the display substrate of claim 1.

15. The display device according to claim 14, wherein at least two light-emitting control signal lines in the display substrate comprise a first light-emitting control signal line and a second light-emitting control signal line; at least two light-emitting control sub-circuits comprise a first light-emitting control sub-circuit and a second light-emitting control sub-circuit; at least two light-emitting elements comprise a first light-emitting element and a second light-emitting element;
a plurality of pixel driving circuits comprised in a plurality of sub-pixel groups in the display substrate are arranged in an array, the plurality of pixel driving circuits are divided into a plurality of rows of pixel driving circuits arranged in the second direction, first light-emitting control signal lines in the plurality of rows of pixel driving circuits are coupled, and second light-emitting control signal lines in the plurality of rows of pixel driving circuits are coupled;
the display device further comprises: a gate driving circuit located in a peripheral region of the display substrate, wherein the gate driving circuit comprises a plurality of first shift register units and a plurality of second shift register units; the plurality of first shift register units is in one-to-one correspondence with the plurality of rows of pixel driving circuits, and the plurality of second shift register units is in one-to-one correspondence with the plurality of rows of pixel driving circuits;
an output terminal of each of the plurality of first shift register units is coupled to a first light-emitting control signal line in a corresponding row of pixel driving circuits, and an output terminal of each of the plurality of the second shift register units is coupled to a second light-emitting control signal line in a corresponding row of pixel driving circuits.

16. The display device according to claim 14, wherein the pixel driving circuit in the display substrate further comprises:
a reference signal line, at least part of the reference signal line extending in the first direction;
a first reset signal line, at least part of the first reset signal line extending in the first direction;
a gate line, at least part of the gate line extending in the first direction;
a power source line, at least part of the power source line extending in a second direction; and,
a data line, at least part of the data line extending in the second direction;
wherein the compensation driving sub-circuit comprises:
a driving sub-circuit, a first terminal of the driving sub-circuit is coupled to the power source line, and a second terminal of the driving sub-circuit is the output terminal of the compensation driving sub-circuit;
a storage sub-circuit, a first terminal of the storage sub-circuit is coupled to a control terminal of the driving sub-circuit, and a second terminal of the storage sub-circuit is coupled to the second terminal of the driving sub-circuit;
a first reset sub-circuit, coupled to the first reset signal line, the reference signal line and the control terminal of the driving sub-circuit; and
a data writing sub-circuit, coupled to the gate line, the data line and the control terminal of the driving sub-circuit.

17. The display device of claim 16, wherein in the display substrate, the at least two light-emitting control signal lines comprise a first light-emitting control signal line and a second light-emitting control signal line; the at least two light-emitting control sub-circuits comprise a first light-emitting control sub-circuit and a second light-emitting control sub-circuit; the at least two light-emitting elements comprise a first light-emitting element and a second light-emitting element;
the first light-emitting control sub-circuit is coupled to the second terminal of the driving sub-circuit, the first light-emitting control signal line and the first light-emitting element; the second light-emitting control sub-circuit is coupled to the second terminal of the driving sub-circuit, the second light-emitting control signal line, and the second light-emitting element.

18. The display device of claim 17, wherein the first light-emitting control sub-circuit comprises a first transistor, the second light-emitting control sub-circuit comprises a second transistor, and the driving sub-circuit comprises a drive transistor; the storage sub-circuit comprises a storage capacitor;
a gate electrode of the drive transistor is reused as a first electrode plate of the storage capacitor;
a second electrode plate of the storage capacitor is located at a side of the first electrode plate facing away from the substrate, and the second electrode plate is coupled to a second electrode of the drive transistor;
a first electrode of the first transistor is coupled to the second electrode of the drive transistor, and a second electrode of the first transistor is coupled to the first light-emitting element;
a first electrode of the second transistor is coupled to the second electrode plate, and a second electrode of the second transistor is coupled to the second light-emitting element.

19. The display device according to claim 16, wherein an orthographic projection of the first reset signal line onto the substrate is located between an orthographic projection of the reference signal line onto the substrate and an orthographic projection of the gate line onto the substrate;

the first reset sub-circuit comprises a third transistor, the third transistor comprises a third active pattern, the third active pattern extends in the second direction, a first terminal of the third active pattern is coupled to the reference signal line, an orthographic projection of a second terminal of the third active pattern onto the substrate is located between the orthographic projection of the first reset signal line onto the substrate and the orthographic projection of the gate line onto the substrate.

20. The display device according to claim 19, wherein the gate line comprises a gate body portion and two gate protruding portions, the gate body portion extends in the first direction, the two gate protruding portions are provided at an interval in the first direction, the two gate protruding portions are located between the gate body portion and the first reset signal line;

the data writing sub-circuit comprises a fourth transistor, the fourth transistor comprises a fourth active pattern, the fourth active pattern extends in the first direction, and an orthographic projection of the fourth active pattern onto the substrate overlaps with orthographic projections of the two gate protruding portions onto the substrate, respectively;

a first terminal of the fourth active pattern is coupled to the data line, and a second terminal of the fourth active pattern is coupled to the second terminal of the third active pattern.

* * * * *